United States Patent [19]

Lewandowski

[11] Patent Number: 4,522,849

[45] Date of Patent: Jun. 11, 1985

[54] METHOD FOR COATING QUARTZ WITH BORON NITRIDE

[75] Inventor: Robert S. Lewandowski, Amsterdam, N.Y.

[73] Assignee: General Electric Company, Schenectady, N.Y.

[21] Appl. No.: 542,917

[22] Filed: Oct. 18, 1983

Related U.S. Application Data

[63] Continuation of Ser. No. 282,328, Jul. 10, 1981, abandoned.

[51] Int. Cl.$^3$ .......................... B05D 7/22; C23C 11/00
[52] U.S. Cl. ...................................... 427/237; 427/87; 427/255; 427/255.2; 427/314; 428/427
[58] Field of Search ..................... 427/255.2, 314, 255, 427/237, 82, 86, 87, 105, 107, 106, 108, 109, DIG. 10; 428/427

[56] References Cited

U.S. PATENT DOCUMENTS

| | | | |
|---|---|---|---|
| 3,540,926 | 11/1970 | Rairden | 427/255.2 |
| 3,692,566 | 9/1972 | Branovich et al. | 427/237 |
| 3,734,817 | 5/1973 | Bienert et al. | 427/DIG. 10 |
| 3,746,569 | 7/1973 | Pammer et al. | 427/237 |
| 4,297,387 | 10/1981 | Beale | 427/255.2 |

OTHER PUBLICATIONS

Shohno et al., Proceedings of the Seventh International Conference on Chemical Vapor Deposition, p. 234, 1979.

*Primary Examiner*—S. L. Childs
*Attorney, Agent, or Firm*—Robert J. Jarvis; James C. Davis, Jr.; Marvin Snyder

[57] ABSTRACT

A method for coating quartz with a protective boron nitride film constitutes heating the quartz member to a temperature of 900° C. to 1000° C. in a stream of inert gas. After heating the quartz member to the desired temperature, the flow of inert gas is discontinued, whereupon ammonia and diborane gases, mixed at a temperature of 200° C. to 400° C., are allowed to flow past the quartz member. The flow of mixed ammonia and diborane gases is maintained for a time sufficient to deposit a boron nitride film of desired thickness. The boron nitride is produced by chemical reaction between ammonia and diborane.

6 Claims, 3 Drawing Figures

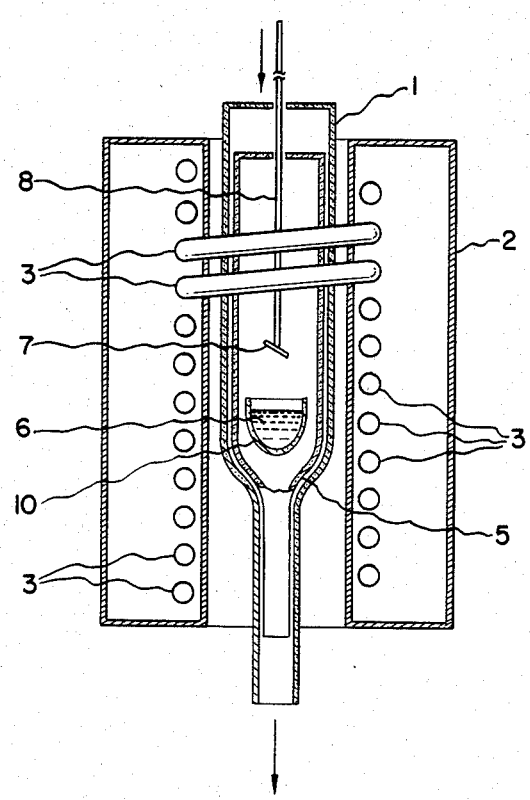
Fig. 1
(PRIOR ART)
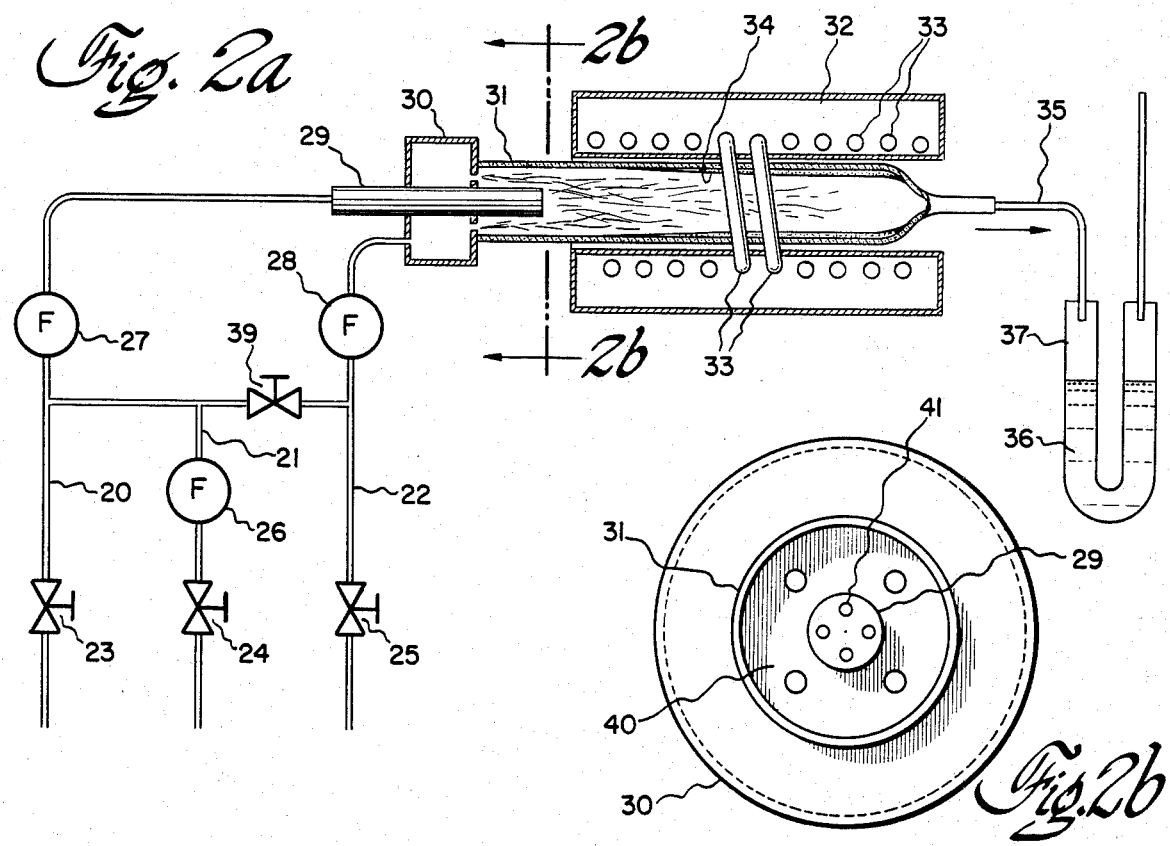
Fig. 2a
Fig. 2b

METHOD FOR COATING QUARTZ WITH BORON NITRIDE

This application is a continuation, of application Ser. No. 282,328, filed July 10, 1981, now abandoned.

BACKGROUND OF THE INVENTION

The present invention relates to a method of applying a protective boron nitride (BN) film to quartz.

In order to obtain desired electrical properties in solid state devices, the composition of semiconductor materials from which the devices are fabricated is carefully controlled and maintained free of contaminants. Frequently, semiconductor materials are prepared by conventional liquid epitaxial growth methods (described more fully hereinafter) wherein molten semiconductor material is held in a crucible positioned within a quartz tube disposed in a furnace. It has been found, however, that due to high temperatures involved, the semiconductor material may be contaminated by silicon derived from the quartz tube. Such contamination renders materials such as gallium phosphide (GaP) and gallium arsenide (GaAs), for example, unsuitable for fabricating light-emitting diodes and power transistors, respectively.

In the past, one approach employed to minimize silicon contamination of semiconductor material has been to machine from sintered BN a tubular member, which when inserted into the aforementioned quartz tube, provides a silicon impermeable barrier between the semiconductor material and the quartz tube. This approach is generally unsatisfactory because the separate BN member is expensive to manufacture, does not entirely avoid contamination, and does not protect quartz from attack by acids used to cleanse the apparatus.

The present invention provides a method for directly coating quartz with a protective BN film, which forms an integral structure with the quartz. The inventive method provides a coating which is economical to fabricate, protects quartz from acid attack, and provides superior resistance to thermal shock. Since the BN film adheres tightly to quartz, superior protection from silicon contamination of the semiconductor material is also provided.

SUMMARY OF THE INVENTION

A method for coating a quartz member with protective BN film comprises heating the quartz member to between 900° C. and 1000° C. in a stream of inert gas, such as argon. Ammonia and diborane gases, which react to form the BN film, are mixed at a temperature of between about 200° C. and about 400° C., and when the temperature of the quartz member rises to between approximately 900° C. to 1000° C., the inert gas stream is replaced with a flow of mixed ammonia and diborane gases. Ammonia-diborane gas flow is allowed to continue for a time sufficient to deposit a BN film of desired thickness. In one application, the inventive method is employed to coat the interior surfaces of a quartz tube, used in apparatus for epitaxial growth of semiconductor material, with a BN protective film. This is accomplished by directing ammonia-diborane gas flow through the tube interior.

Depending on the desired film thickness, ammonia and diborane gas flow may be maintained from about one-quarter hour to about six hours, or longer. In this manner, BN films ranging in thickness from less than 1 micron to 150 microns or more may be successfully fabricated, the thickness of the BN film increasing with increased time.

Accordingly, it is an object of the invention to provide an economical method for applying protective BN film to quartz.

It is another object of the invention to provide a method for coating quartz with BN film resulting from chemical reaction between ammonia and diborane gases.

It is still another object of the invention to provide a method for coating with BN film the interior surfaces of a quartz tube which forms part of an apparatus for liquid epitaxial growth of semiconductor materials.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 1 is a sectional view of an apparatus for liquid epitaxial growth of semiconductor material, including a conventional BN protective member machined from sintered BN;

FIG. 2a is a sectional view of an apparatus for practicing the method of the present invention, depicting a protective BN film deposited on the interior walls of a quartz tube; and FIG. 2b is a cross-sectional view taken along line 2b—2b of the apparatus shown in FIG. 2a, depicting details of a nozzle assembly for mixing ammonia gas and diborane gas.

DETAILED DESCRIPTION OF THE INVENTION

FIG. 1 is a sectional view of conventional apparatus for liquid epitaxial growth of semiconductor materials. The apparatus comprises a tubular quartz member 1 having one tapered end. Quartz member 1 is disposed in oven 2 which may be conveniently heated by resistive heater elements 3 and has disposed therein a similarly configured tubular member 5 machined from sintered BN. A BN crucible 10 containing suitable semiconductor material 6 is disposed within tubular member 5. Liquid epitaxial growth of the semiconductor material occurs when plunger 8, having a selected semiconductor starter material 7 affixed thereto, is lowered into similar molten semiconductor material 6 and then allowed to cool slowly and then withdrawn. Venting of the apparatus is accomplished by directing a gas stream through tubular quartz member 1 in a direction indicated by the arrows at each end thereof.

The function of BN tubular member 5 is to protect semiconductor materials 6 and 7 from contamination by silicon evolving from tubular quartz member 1 at high temperature. This method of minimizing contamination is not entirely satisfactory since it is quite expensive to machine member 5 from sintered BN. Additionally, since member 5 is a discrete element, separate from quartz tube 1, it is less able to withstand the extreme temperature variations associated with the liquid epitaxial growth process. Quartz tube 1 is also unprotected from the corrosive effects of aqua regia (3 parts hydrochloric acid and 1 part nitric acid), nitric acid ($HNO_3$), and hydrofluoric acid (HF) employed during cleansing.

In contrast, the present invention provides a method for directly coating quartz with BN film to form an integral structure which is better able to meet the aforementioned requirements.

FIG. 2a illustrates apparatus for practicing the inventive method. A tubular quartz member 31 (similar to tubular quartz member 1 in FIG. 1) is positioned within furnace 32 which may be heated by resistive elements 33. Various gases may be introduced into the interior of tubular quartz member 31 through end cap 30 and nozzle 29. Thus inert argon gas for purging tube 31 may be introduced through valve 24, flow meters 26 and 27, and into tube 31 through nozzle 29. Alternatively, or simultaneously, argon may be introduced into tube 31 through end cap 30 which is supplied through valve 39 and flow meter 28. Diborane ($B_2H_6$) gas is injected into tube 31 through valve 23 and flow meter 27, while ammonia ($NH_3$) gas is supplied through valve 25 and flow meter 28. FIG. 2b depicts a detailed view of end cap 30 and nozzle 29, having holes 40 and 41, respectively, for ensuring thorough gas mixing and preventing laminar gas flow which would tend to promote uneven BN deposition. Gases may be vented from within quartz tube 31 through exhaust tube 35 connected to a tapered end thereof and then a U-tube bubbler 37 containing silicone oil 36 (available from Dow-Corning, Midland, Mich. as "Liquid Silicon Diffusion Pump Fluid" No. 704).

The chemical reaction by which boron nitride is formed may be stated as $B_2H_6 + 2NH_3 \rightarrow 2BN + 6H_2$. Hydrogen ($H_2$) gas, along with any unreacted $B_2H_6$, $NH_3$, and argon, as well as any other gases present, is removed through U-tube bubbler 37. BN is deposited on the inner surface of quartz tube 31 as a thin film 34 (FIG. 2a).

In practicing the invention, quartz tube 31 is heated to a temperature of between approximately 900° C. and approximately 1000° C., while purging the interior of the tube with a suitable inert gas such as argon. When quartz tube 31 reaches the desired temperature, purging is discontinued and $NH_3$ and $B_2H_6$ gases are introduced into the tube through end cap 30 and nozzle 29, respectively. It is important to note that the temperature of the tube region where $B_2H_6$ and $NH_3$ mix is preferably between 200° C. and 400° C. If the mixing temperature is too low $B_2H_6$ reacts to produce a white powder precipitate in the cooler parts of quartz tube 31. Conversely, if the mixing temperature is too high, $B_2H_6$ decomposes into a brownish precipitate. The desired mixing temperature range may be achieved by, for example, adjusting the distance between furnace 32 and each of end cap 30 and nozzle 29.

Ammonia gas flow may be at a rate of 140 cc/min while diborane gas may be allowed to flow at the rate of 40 cc/min. Due to the flammable and explosive nature of diborane gas, it is mixed with argon gas, so that commercially supplied diborane gas, as utilized in the invention, comprises only 1.5 percent diborane. Ammonia may also be mixed with argon gas by commercial suppliers, if desired, to regulate concentration. The flow of mixed $B_2H_6$ and $NH_3$ gases (including any argon gas mixed therewith) is maintained for up to 6 hours or longer, depending on the desired thickness of the BN coating. Satisfactory BN films of thickness less than 1 micron to more than 150 microns have been deposited on quartz using the inventive method. Good adhesion of BN film to quartz is demonstrated by its resistance to concentrated acids, such as $HNO_3$, HCl, and HF.

From the foregoing, it will be appreciated that the present invention provides an economical method for applying a BN coating to quartz. In special applications, such as in liquid epitaxial growth of semiconductor materials, the coating is an effective, economical means for avoiding silicon contamination and providing resistance to corrosive acids employed in cleaning quartz. Since the BN film form an integral structure with the quartz, superior resistance to thermal shock due to temperature variation is also provided.

While certain preferred features of the invention have been shown by way of illustration, many modifications and changes will occur to those skilled in the art. It is, therefore, to be understood that the appended claims are intended to cover all such modifications and changes as fall within the true spirit of the invention.

The invention claimed is:

1. A method for coating a quartz member with protective nitride film, said method comprising the steps of:
   heating said quartz member in a furnace having an inert gas flowing therethrough for a time sufficient for said quartz member to reach a temperature between about 900° C. and 1,000° C.;
   mixing at a temperature between about 200° C. and 400° C. ammonia gas and diborane gas, and initiating flow of the mixed ammonia and diborane gases past said quartz member when said quartz member has reached said temperature between about 900° C. and 1,000° C. and after discontinuing flow of said inert gas; and
   allowing said mixed ammonia and diborane gases to flow past said quartz member for a time sufficient to coat said quartz member with boron nitride film of desired thickness, said boron nitride being the product of a chemical reaction between said ammonia and diborane gases.

2. The method of claim 1 wherein said inert gas comprises argon.

3. The method of claim 1 wherein said mixed ammonia and diborane gases are allowed to flow past said quartz member for a time between about one-quarter hour and about 6 hours.

4. A method of applying a protective boron nitride film to the interior of a quartz tube, said method comprising the steps of:
   heating said quartz tube to between about 900° C. and 1000° C., and purging the interior of said tube with inert gas;
   mixing at a temperature of between about 200° C. and 400° C. ammonia gas and diborane gas and initiating flow of the mixed ammonia and diborane gases through the interior of said quartz tube when the temperature of said quartz tube has reached said temperature of between about 900° C. and 1000° C. and after discontinuing flow of said inert gas; and
   allowing said mixed ammonia and diborane gases to flow through said quartz tube for a time sufficient to coat the interior of said quartz tube with a boron nitride film of desired thickness, said boron nitride being the product of a chemical reaction between said ammonia and diborane gases.

5. The method of claim 4 wherein said mixed ammonia and diborane gases are allowed to flow through said quartz tube for a time between about one-quarter hour and about 6 hours.

6. The method of claim 5 wherein said inert gas comprises argon.

* * * * *